United States Patent
Nguyen et al.

(10) Patent No.: US 6,414,522 B1
(45) Date of Patent: Jul. 2, 2002

(54) BIAS GENERATING CIRCUIT FOR USE WITH AN OSCILLATING CIRCUIT IN AN INTEGRATED CIRCUIT CHARGE PUMP

(75) Inventors: Hung Q. Nguyen, Fremont; Sang Nguyen, Oakland, both of CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/661,681

(22) Filed: Sep. 14, 2000

(51) Int. Cl.[7] ............................................... H03C 3/00
(52) U.S. Cl. ........................ 327/101; 327/157; 327/277; 331/57; 331/185
(58) Field of Search .................................. 327/101, 102, 327/148, 157, 277, 278, 536, 534, 537; 331/57, 185

(56) References Cited

U.S. PATENT DOCUMENTS

| | | | |
|---|---|---|---|
| 4,922,141 A | * 5/1990 | Lofgren et al. | 327/277 |
| 5,231,319 A | * 7/1993 | Crafts et al. | 327/277 |
| 5,418,499 A | * 5/1995 | Nakao | 331/57 |
| 5,544,120 A | * 8/1996 | Kuwagata et al. | 365/222 |
| 5,559,476 A | * 9/1996 | Zhang et al. | 337/57 |
| 6,064,275 A | * 5/2000 | Yamauchi | 331/57 |
| 6,252,467 B1 | * 1/2001 | Yoshimura | 331/57 |
| 6,188,293 B1 | * 2/2001 | Miyagi et al. | 337/57 |

* cited by examiner

Primary Examiner—Terry D. Cunningham
(74) Attorney, Agent, or Firm—Gray, Cary, Ware & Freidenrich LLP

(57) ABSTRACT

In an improved charge pump bias generating circuit for a charge pump for a semiconductor integrated circuit device, the pump has a bias generator which has an input for receiving a pump enable signal. The bias generator generates a ramped bias signal in response to the pump enable signal. A voltage controlled oscillator has an input to receive the ramped bias signal and generates an oscillating signal having a frequency which is dependent upon the voltage of the ramped bias signal. As a result, the sudden turn on of the pump enable signal would cause a gradual turn on of the voltage controlled oscillator gradually turning on the clock output signal from the voltage oscillator, thereby reducing power surge in the circuit.

5 Claims, 5 Drawing Sheets

US 6,414,522 B1

BIAS GENERATING CIRCUIT FOR USE WITH AN OSCILLATING CIRCUIT IN AN INTEGRATED CIRCUIT CHARGE PUMP

TECHNICAL FIELD

The present invention relates to an improved bias generating circuit portion of a charge pump circuit of a semiconductor integrated circuit device, and more particularly to such an improved charge pump bias generating circuit outputting a ramped oscillation signal to an oscillating circuit thereby decreasing the instantaneous power drain of the charge pump circuit upon start up.

BACKGROUND OF THE INVENTION

Charge pumps circuits for a semiconductor integrated circuit device are well known in the art. They are used typically to pump up a voltage supply, external to the semiconductor integrated circuit device, to a higher level for use within the semiconductor integrated circuit device. Thus, they can be used to boost an externally supplied voltage to a high voltage for use in non-volatile memory applications, Typically, a charge pump circuit consists of an oscillating circuit as well as a bias generator circuit which supplies the voltage to the oscillating circuit. The oscillating circuit is typically a circuit that responds to the voltage level from the bias generator and generates a signal whose frequency depends upon the voltage from the bias generator.

Referring to FIG. 1A, there is shown a circuit diagram of the bias generator circuit 12 and oscillator circuit 11 of a charge pump circuit 10 of the prior art. The bias generator circuit 12 receives a pump enable signal 8 and generates bias signal 20 which is supplied to the oscillator circuit 11. In addition, the bias generator 12 supplies the pump enable signal 8 and the inverse pump enable signal 22 to the oscillator circuit 11. The bias generator circuit 12 comprises an inverter 14 which receives the pump enable signal 8. The output of the inverter 14 is connected to the gate of a PMOS transistor 16 having one terminal connected to the source of an operating voltage VDD and a second terminal connected to one end of a resistor 17. The other end of the resistor 17 is connected to an NMOS transistor 18 at one terminal thereof as well as to its gate. Finally, the other terminal of the NMOS transistor 18 is connected to ground. The pump enable signal 8 is also supplied to the oscillator circuit 11. The output of the inverter 14 is supplies as the inverse pump enable signal 22 to the oscillator circuit 11. Finally, the gate of the NMOS transistor 18 is the bias signal 20 which is supplied to the oscillator circuit 11.

The oscillator circuit 11 is of well known design and comprises essentially a timing circuit which generates a clock signal having a frequency which depends upon the voltage of the bias signal 20.

In operation, when the pump enable signal 8 is generated (active high) causing the bias generator 12 to generate the bias signal 20 which is supplied to the oscillator circuit 11, the oscillator circuit 11 would begin to oscillate. A simulation of the output of the oscillator circuit 11 at output is shown in FIG. 1B. As can been seen, during initial start up (i.e. as soon as the pump enable signal 8 is active high) there is a large spike in voltage, as can be seen by the left side of FIG. 1B. This results in a temporary power surge within the chip caused by the huge di/dt. This power surge can cause problems in other portions of the semiconductor integrated circuit device such as triggering other signals such as power-on-reset or other signals incorrectly.

SUMMARY OF THE INVENTION

In accordance with the present invention, a charge pump of an integrated circuit device comprises a bias generating circuit with an input for receiving a pump enable signal and generates a ramped bias signal in response to the pump enable signal. A voltage control oscillator has an input for receiving the ramped bias signal and generates an oscillating signal having a frequency dependent upon the voltage of the ramped bias signal.

BRIEF DESCRIPTION OF THE DRAWINGS

FIG. 1B is a simulating timing diagram of the output of the oscillator circuit for a charge pump of the prior art shown in FIG. 1A, after the pump enable signal is turned on.

DETAILED DESCRIPTION OF THE DRAWINGS

Figure 1A:
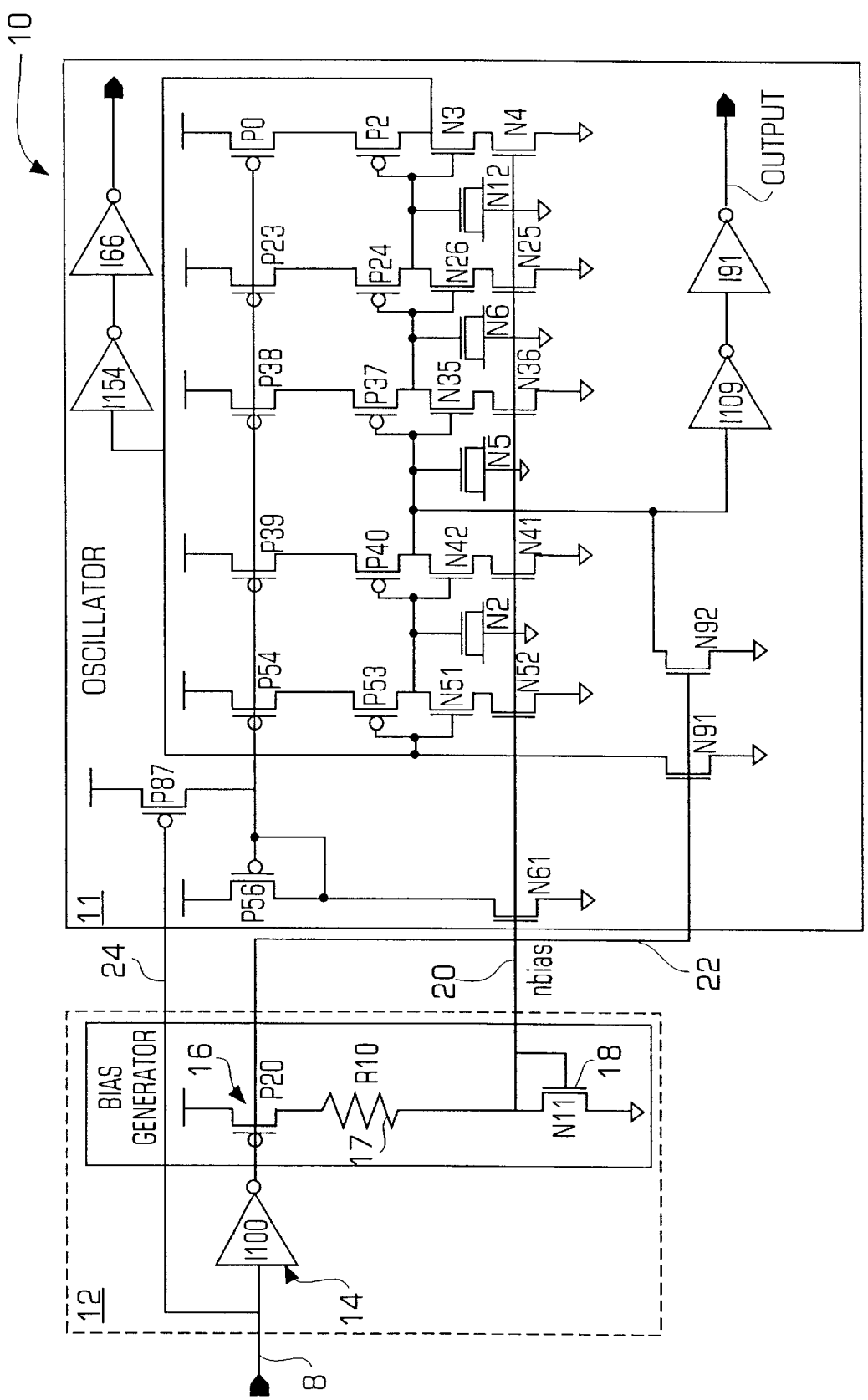
FIG. 1A is a circuit diagram of a bias generating circuit and its associated oscillator circuit for use in a charge pump of the prior art.
Figure 1B:
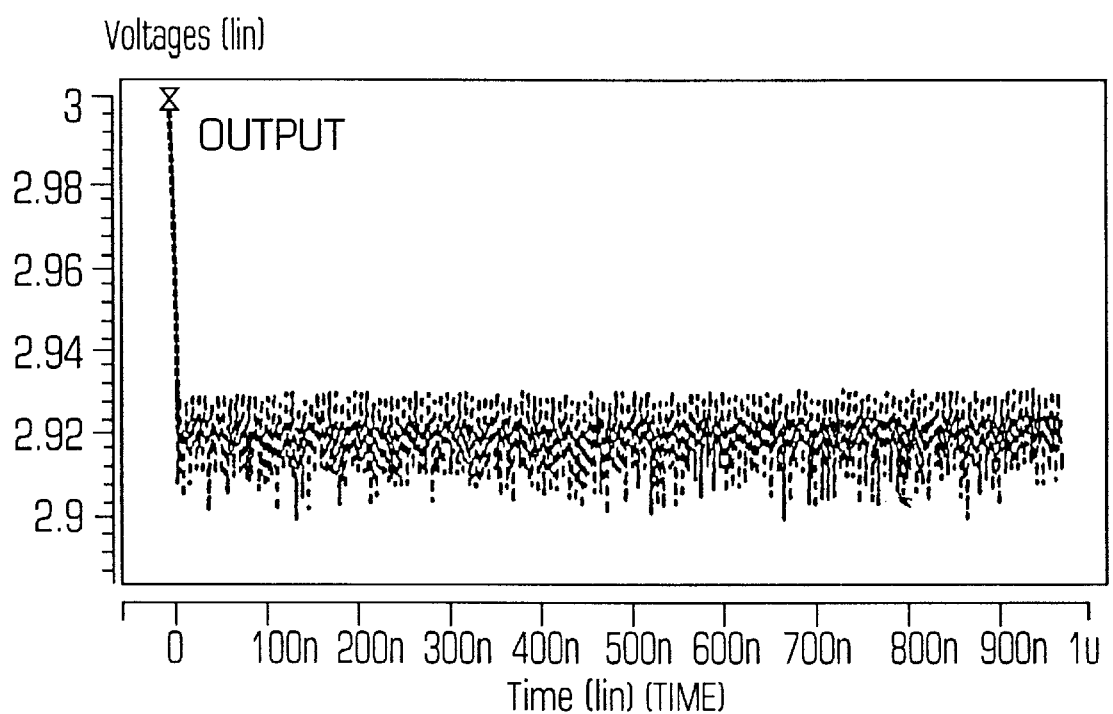
Figure 2B:
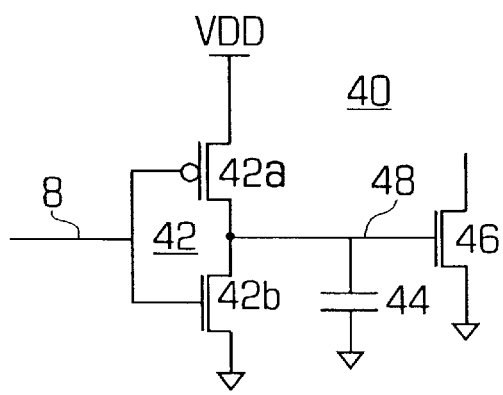
FIG. 2B is a detailed circuit diagram of a portion of the improved bias generator circuit shown in FIG. 2A.
Figure 2A:
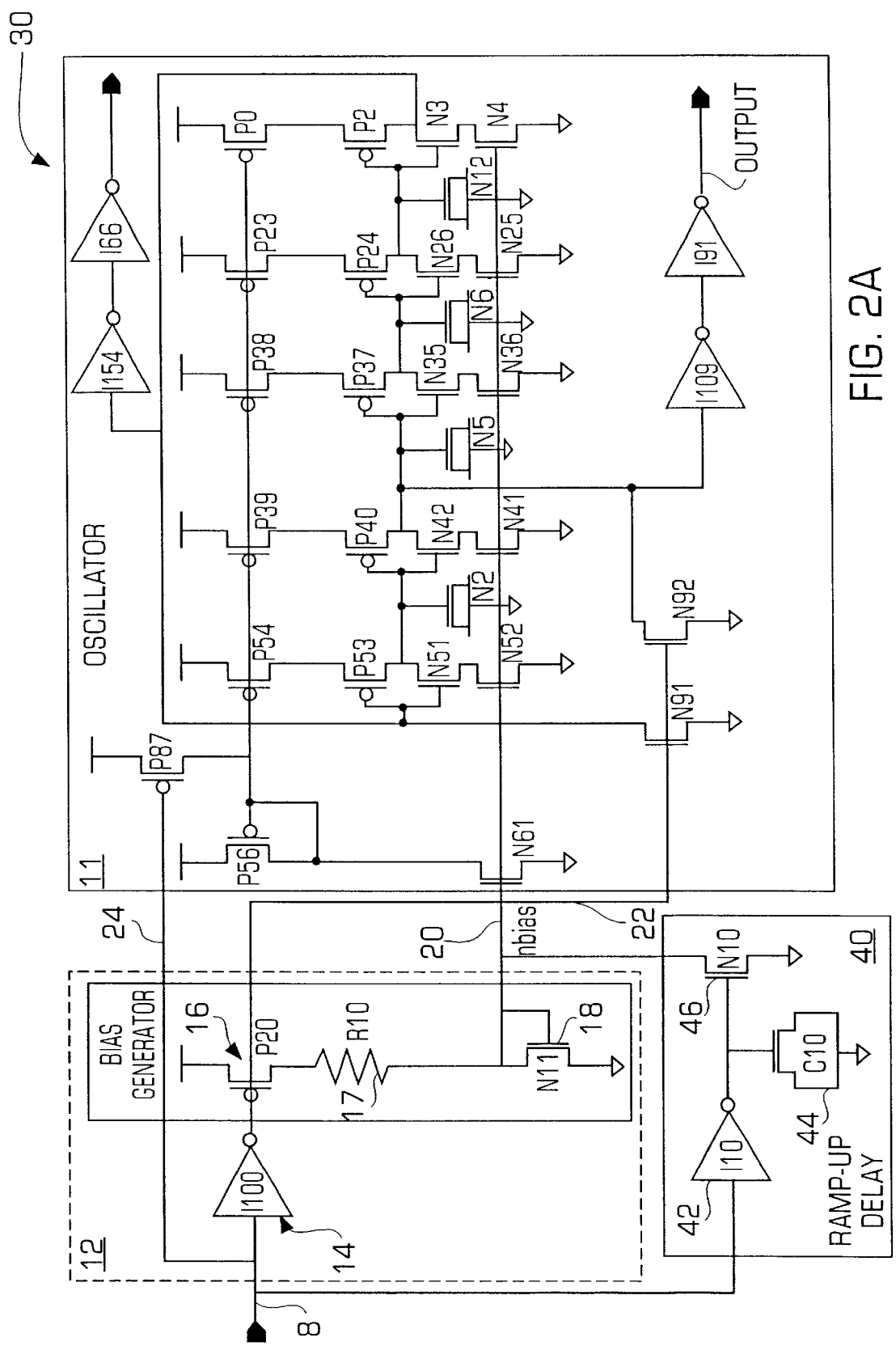
FIG. 2A is a circuit diagram of the preferred embodiment of the improved bias generating circuit of the present invention with its associated oscillator circuit for use in a charge pump.

Referring to FIG. 2A, there is shown a circuit diagram of the improved charge pump bias generator 30 of the present invention. The improved charge pump bias generator 30 comprises the bias generator circuit 12 of the prior art shown in FIG. 1A and a ramp up delay circuit 40. The bias generator circuit 12 and the ramp up delay circuit 40 are connected to an oscillator circuit 11 of the prior art, shown in FIG. 1A The ramp up delay circuit 40 receives the pump enable signal 8. The ramp up delay circuit 40 comprises an inverter 42 which receives the pump enable signal 8. As shown in FIG. 2B, the inverter 42 comprises a PMOS transistor 42A and a NMOS transistor 42B having gates that are connected together, to receive the pump enable signal 8. A first terminal of PMOS transistor terminal 42A is connected to the external voltage source VDD with the second terminal connected to node 48. The first terminal of the NMOS transistor 42B is also connected to node 48 with the second terminal of the NMOS transistor 42B connected to ground. The capacitor 44 has one terminal connected to node 48 and a second terminal connected to ground. In the preferred embodiment, the capacitor 44 is made from the capacitance of an NMOS transistor, i.e. the gate of an NMOS transistor is connected node 48 with the source and drain of the NMOS transistor 44 connected together to ground. The NMOS transistor 46 has its gate connected to node 48. A first terminal of the NMOS transistor 46 is connected to the bias signal 20. A second terminal of the NMOS transistor 46 is connected to ground. Transistor 42A and 42B each has a channel length greater than it width and in the preferred embodiment, each has a channel length 20 times greater than its width.

In the operation of the improved charge pump circuit 30, the pump signal 8 is an active high signal. When the pump signal 8 is low, the output of the inverter 40 within the bias generator circuit 12 generates a high signal which turns off the PMOS transistor 16. As a result, the output of the bias generator circuit 12 provides the bias signal 20 as low. In addition, with the pump enable signal 8 low, the output of the inverter 42 is high. This turns on the NMOS transistor 46, bringing bias signal 20 to ground through the NMOS transistor 46. As a result, the oscillator circuit 14 would not oscillate.

When the pump enable signal 8 goes high, the output of the inverter 14 in the bias generator circuit 12 would be low. This then turns on the PMOS transistor 16, raising the bias signal 20 to high state. However, at the same time, the output of the inverter 42 in the ramp up delay circuit 40 is low. But during the time that preceded the switching of the pump enable signal 8 from low to high, the capacitor 44 would have been charged to a high level. This would maintain the transistor 46 in a conduction state causing the bias signal 20 to be conducted through the NMOS transistor 46 to ground. As soon as the pump enable signal 8 goes high, PMOS transistor 42A of the inverter 42 is turned off. The NMOS transistor 42B of the inverter 42 is turned on. This causes the voltage on the capacitor 44 and node 48 to discharge through transistor 42B which acts as a resistor to thereby slowly turn off the NMOS transistor 46. Thus, a RC network comprising of the capacitor 44 and the resistive effect of the channel through the NMOS transistor 42B forms a RC network which slowly turns off the NMOS transistor 46. As the NMOS transistor 46 is slowly turned off, the bias signal 20 is slowly raised.

Figure 2C:
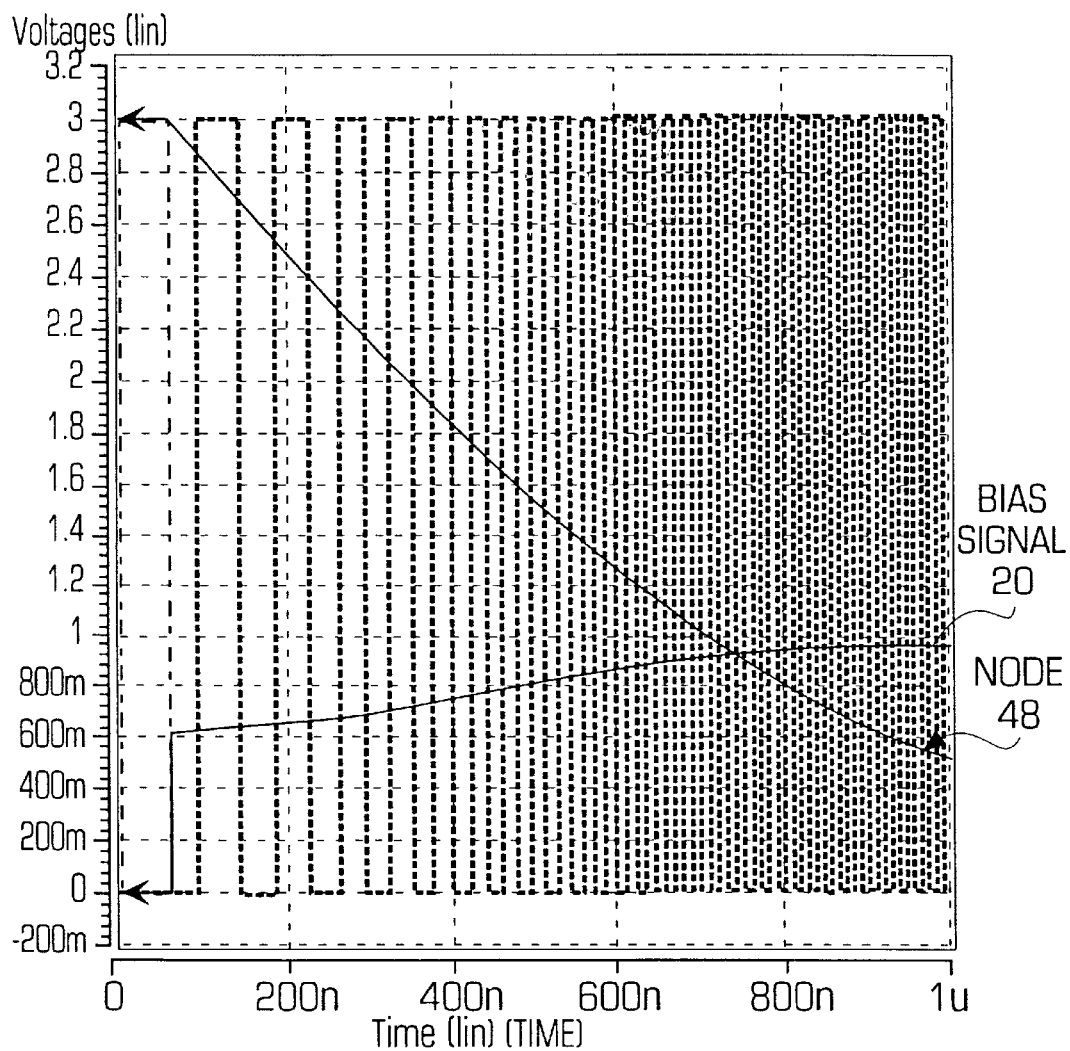
FIG. 2C is a simulated timing diagram of the results of the operation of the improved bias generator circuit shown in FIG. 2A.

Referring to FIG. 2C, there is shown a graph of voltage versus time of the voltage at node 48 and the voltage of the bias signal 20. As can be seen in FIG. 2C, the voltage at node 48 is slowly reduced. As this voltage is slowly reduced, NMOS transistor 46 is gradually turned off which then causes the bias signal 20 to be gradually ramped up (also shown). Since the bias signal 20 is slowly ramped up, there is less di/dt which is less power surge within the chip to cause the problems described heretofore.

Figure 3:
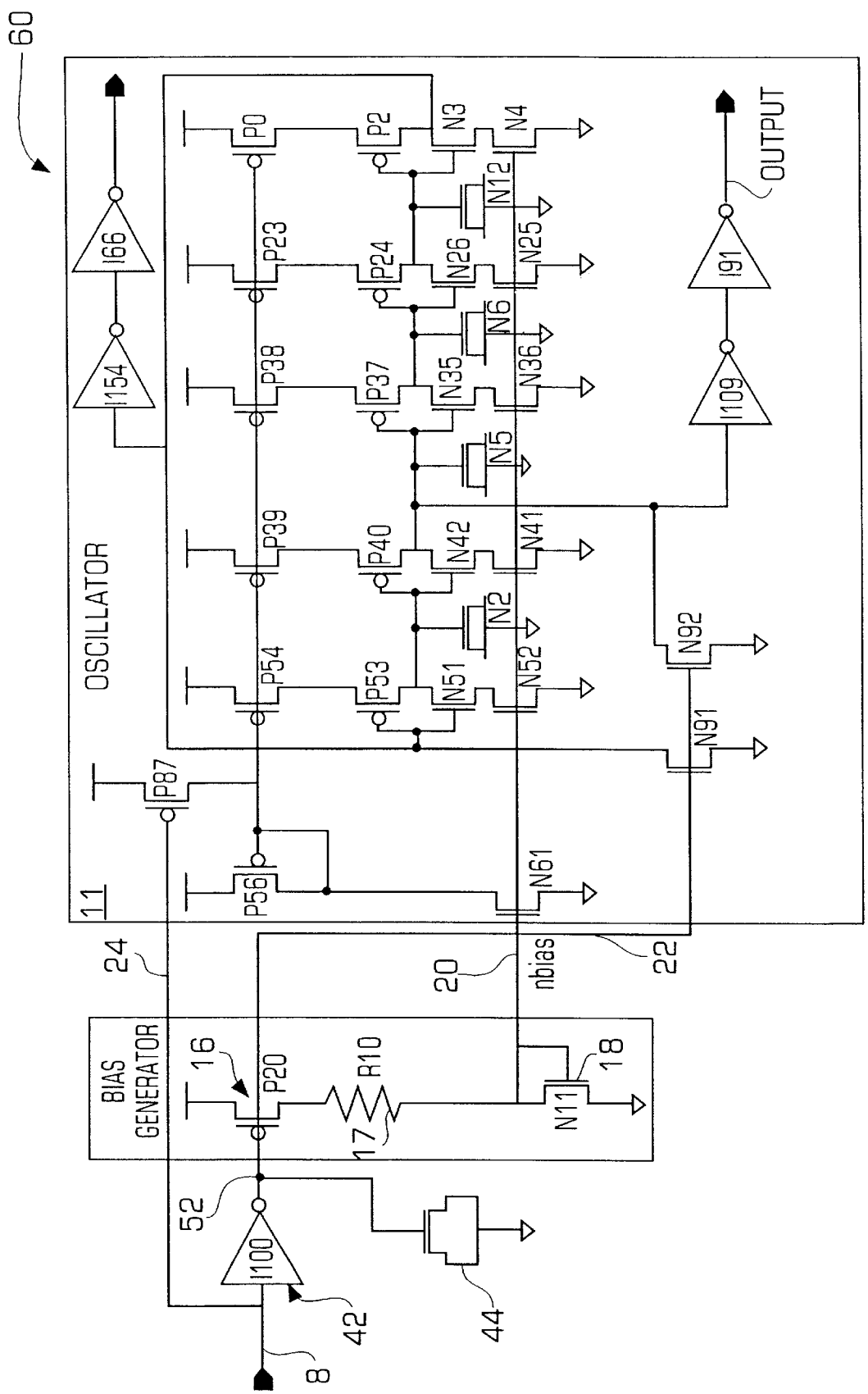
FIG. 3 is a circuit diagram of another embodiment of the improved bias generator circuit of the present invention for use in a charge pump.

Referring to FIG. 3, there is shown a circuit diagram of another embodiment of the improved charge pump bias generator circuit 60 of the present invention. The improved charge pump bias generator circuit 60 shown in FIG. 3 is connected to the conventional prior art oscillating circuit 11. The bias generator 60 receives the pump enable signal 8. An inverter 42, having transistors whose channel length is at least 20 times greater than its width, shown and described in FIG. 2B, is connected to receive the pump enable signal 42. The output of the inverter 42 is connected to node 52. A capacitor 44 of the type shown in FIG. 2B has one terminal connected to node 52 and the other terminal connected to ground. The PMOS transistor 16 has its gate connected to node 52 and one terminal to the voltage source VDD. The other terminal of the PMOS transistor 16 is connected through resistor 17 to the bias signal 20. Finally, the NMOS transistor 18 has it's gate connected to the bias signal 20 and its second terminal to ground. The output of the inverter 42 is also supplied as the inverse pump signal 22 to the oscillator 11. Finally, the pump enable signal 8 is also supplied to the oscillator 11.

In the operation of the improved charge pump bias generator circuit 60, when the pump enable signal 8 is low, the output of the inverter 42 at node 52 would be high. This turns off the PMOS transistor 16 and thus no bias signal 20 is generated. This results in the oscillator 11 not outputting any oscillation signals. In addition, however, with node 52 at high, this charges the capacitor 44 to a high value.

When the pump signal 8 goes high, the inverter 42 would change its state and go to low. However, the voltage on node 52 of the capacitor 44 would still be at high and would maintain the PMOS transistor 16 in a non-conducting state. As the voltage on the capacitor 44 discharges through the NMOS transistor 42B, gradually, as in a RC circuit, the PMOS transistor 16 is turned on. This then gradually turns on the bias signal 20.

The problem with the embodiment shown in FIG. 3 is that as the pump enable signal 8 goes from high to low, the bias generator circuit 50 would not abruptly switch off the bias signal 20 but would gradually ramp down the bias signal 20. Thus, the bias generator circuit 60 ramps up and ramps down in response to the pump enable signal changing its state.

What is claimed is:

1. A circuit for use in a charge pump of an integrated circuit device comprising:
   a bias generator having an input for receiving a pump enable signal and for generating a ramped bias signal in response to said pump enable signal; and
   a voltage controlled oscillator having an input for receiving said ramped bias signal and for generating an oscillating signal having a frequency dependent upon the voltage of said ramped bias signal;
   wherein said bias generator further comprises:
      an inverter having an input for receiving said pump enable signal and having an output for generating a first signal in response thereto;
      a MOS capacitor having a first end connected to said out put of said inverter, and a second end connected to ground; and
      an NMOS transistor having a first terminal, a second terminal and a gate for controlling the flow of circuit between said first and said second terminal, said gate of said NMOS transistor for receiving said first signal, said first terminal connected to ground, and said second terminal connected to said input of said voltage controlled oscillator.

2. The circuit for use in a charge pump of claim 1 wherein said inverter comprises transistors having a channel length greater than its width.

3. The circuit for use in a charge pump of claim 2 wherein said inverter comprises transistors having a channel length at least ten times greater than its width.

4. The circuit for use in a charge pump of claim 3 wherein said inverter comprises transistors having a channel length twenty times greater than its width.

5. A method of generating an oscillator signal in an integrated circuit device in response to a pump enable signal said method comprising:
   generating a ramped bias signal in response to said pump enable signal; and
   supplying said ramped bias signal to a voltage controlled oscillator to generate said oscillator signal, said oscillator signal having a frequency dependent upon the voltage of said ramped bias signal;
   wherein said generating step further comprises:
      generating a bias signal in response to said pump enable signal,
      generating a control signal in response to said pump enable signal, and
      clamping said bias signal by said control signal to produce said ramped bias signal; and
   wherein said generating a control signal step further comprises:
      inverting said pump enable signal to produce a first signal;
      supplying said first signal to a MOS capacitor at a first end, and having a second end connected to ground; and
      supplying said first signal to the gate of a NMOS transistor, said transistor having a first terminal connected to ground and a second terminal connected to said bias signal.

* * * * *